(12) United States Patent
Guitard

(10) Patent No.: US 11,398,549 B2
(45) Date of Patent: Jul. 26, 2022

(54) THYRISTOR SEMICONDUCTOR DEVICE AND CORRESPONDING MANUFACTURING METHOD

(71) Applicant: STMicroelectronics (Crolles 2) SAS, Crolles (FR)

(72) Inventor: Nicolas Guitard, Allevard (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 106 days.

(21) Appl. No.: 16/788,091

(22) Filed: Feb. 11, 2020

(65) Prior Publication Data
US 2020/0258981 A1    Aug. 13, 2020

(30) Foreign Application Priority Data

Feb. 12, 2019 (FR) ...................... 1901379

(51) Int. Cl.
| H01L 29/74 | (2006.01) |
| H01L 29/08 | (2006.01) |
| H01L 27/02 | (2006.01) |
| H01L 27/102 | (2006.01) |
| H01L 29/167 | (2006.01) |
| H01L 29/66 | (2006.01) |

(52) U.S. Cl.
CPC ........ *H01L 29/083* (2013.01); *H01L 27/0248* (2013.01); *H01L 27/1027* (2013.01); *H01L 29/167* (2013.01); *H01L 29/66363* (2013.01); *H01L 29/74* (2013.01)

(58) Field of Classification Search
CPC ................. H01L 29/083; H01L 29/167; H01L 29/66363; H01L 29/74; H01L 27/0248; H01L 27/1027; H01L 2924/13024; H01L 27/0262
USPC .......................................................... 257/107
See application file for complete search history.

(56) References Cited

U.S. PATENT DOCUMENTS

| 8,093,107 | B1 * | 1/2012 | Nemati | ................... G11C 11/39 |
| | | | | 438/133 |
| 2006/0175629 | A1 | 8/2006 | Jumpertz et al. | |
| 2013/0285113 | A1 * | 10/2013 | Edwards | ............ H01L 27/0262 |
| | | | | 257/133 |
| 2019/0131787 | A1 * | 5/2019 | He | ...................... H01L 29/7408 |

FOREIGN PATENT DOCUMENTS

CN    107424990 A    12/2017

* cited by examiner

*Primary Examiner* — Calvin Y Choi
(74) *Attorney, Agent, or Firm* — Seed IP Law Group LLP

(57) ABSTRACT

Thyristor semiconductor device comprising an anode region, a first base region and a second base region having opposite types of conductivity, and a cathode region, all superimposed along a vertical axis.

17 Claims, 3 Drawing Sheets

THYRISTOR SEMICONDUCTOR DEVICE AND CORRESPONDING MANUFACTURING METHOD

BACKGROUND

Technical Field

Embodiments and implementations relate to thyristor semiconductor devices and to the methods of manufacturing such devices.

Description of the Related Art

A thyristor is a semiconductor device typically comprising four alternately N-doped and P-doped semiconductor regions. A thyristor is sometimes called a "Silicon Controlled Rectifier" or "SCR".

Thyristors can be used as components protecting against electrostatic discharges in integrated circuits. Electrostatic discharges can occur on connection terminals of integrated circuits, such as solder pads or pins, during the manufacture or handling of the integrated circuits.

Protection against electrostatic discharges typically necessitates a high current flow capability in order to ensure good protection of the integrated circuits. This results in a large surface area in conventional designs of structures for protection against electrostatic discharges.

It is desirable to use effective devices for protection against electrostatic discharges and to have minimal surface area.

BRIEF SUMMARY

According to one aspect, there is proposed an integrated circuit comprising a substrate having a front face and at least one thyristor semiconductor device situated in and on the substrate and comprising an anode region, a first base region and a second base region having opposite types of conductivity, and a cathode region, all superimposed along an axis transverse to the said front face.

The superimposition of the four semiconductor regions of the thyristor along a single axis transverse to the front face makes it possible to avoid the use of a lateral zone for housing one of these regions. The device according to this aspect thus makes it possible to reduce the surface area used by a thyristor, without however losing performance, notably for the protection against electrostatic discharges.

Firstly, this is advantageous with regard to costs.

The reduction of the size of the semiconductor device also makes it possible to limit current leakages in the cut-off condition and thus to reduce the consumption of energy.

Moreover, the vertical structure of the semiconductor device makes it possible to localize the active regions of the thyristor and thus to reduce its stray capacity. Thus, the device can be connected to nodes sensitive to stray capacity effects, such as nodes routing radiofrequency signals.

According to some embodiments, the first base region is situated between the anode region and the front face of the substrate.

Thus, the first base region is naturally isolated from a semiconductor substrate or a semiconductor well and makes it possible to prevent inadvertent triggerings of the thyristor. In fact, the base region makes it possible to modulate the triggering into the on state of the thyristor and thus parasitic biasings arising for example from the substrate or from the well and able to cause inadvertent triggerings are avoided.

For example, the first base region is laterally isolated from the anode region by a dielectric region such as for example a lateral isolation region of the shallow trench isolation type, having a ring shape for example.

According to some embodiments, the second base region and the cathode region are situated above the front face of the substrate, the second base region being situated between the first base region and the cathode region.

According to some embodiments, the anode region and the second base region comprise P-doped silicon whilst the first base region and the cathode region comprise N-doped silicon.

According to some embodiments, the integrated circuit comprises moreover a core circuit configured for executing functional tasks of the integrated circuit, and connection terminals connected to the core circuit such as metal lines, at least a first connection terminal being intended to receive a power supply voltage during the functioning of the integrated circuit and at least a second connection terminal being intended to receive a reference voltage during the functioning of the integrated circuit, and respectively comprises at least one assembly comprising a thyristor semiconductor device, each assembly being coupled between the said at least a first connection terminal and the said at least a second connection terminal, and each assembly being configured for protecting the core circuit against electrostatic discharges on the said connection terminals.

The integrated circuit can also comprise moreover at least a third connection terminal intended to route input-output signals during the functioning of the integrated circuit, and respectively at least one other assembly comprising a thyristor semiconductor device, each other assembly being coupled between the said at least a third connection terminal and the said at least a first connection terminal or the said at least a second connection terminal, and each other assembly being configured for protecting the core circuit against electrostatic discharges on the said connection terminals.

For example, and as mentioned above, connection terminals intended for routing sensitive signals such as radiofrequency signals can be protected against the electrostatic discharges by such a thyristor device, without degrading the performance of the integrated circuit.

According to some aspects, there is proposed a method of manufacturing an integrated circuit comprising a formation of a thyristor semiconductor device in and on a substrate of the integrated circuit having a front face, the formation of the thyristor semiconductor device comprising a formation of an anode region, a formation of a first base region, a formation of a second base region, the first base region and the second base region having opposite types of conductivity, and a formation of a cathode region, arranged so that the anode region, the first base region, the second base region, and the cathode region are all superimposed along an axis transverse to the front face.

According to some implementations, the formation of the first base region comprises an implantation of dopants in a part of the anode region situated between the rest of the anode region and the front face.

According to some implementations, the formation of the first base region comprises moreover a formation of a dielectric region laterally isolating the said first base region from the said anode region.

According to some implementations, the formation of the second base region comprises a formation of a semiconductor layer above the front face, for example by epitaxy, and the formation of the cathode region comprises a formation of another semiconductor layer above the semiconductor layer of the second base region, for example also by epitaxy.

According to some implementations, the formation of the anode region and the formation of the second base region each comprise a formation of P-doped silicon, whilst the formation of the first base region and the formation of the cathode region each comprise a formation of N-doped silicon.

According to some implementations, the method can comprise moreover a manufacture of bipolar transistors of the npn type and of the pnp type, in which:
- the said formation of the anode region is included in a step of formation of a collector region of the manufacture of the bipolar transistors of the pnp type,
- the said formation of the first base region is included in a step of formation of a base region of the manufacture of bipolar transistors of the pnp type,
- the said formation of the second base region is included in a step of formation of an emitter region of the manufacture of bipolar transistors of the pnp type, or in a step of formation of a base region of the manufacture of bipolar transistors of the npn type, and
- the said formation of the cathode region is included in a step of formation of an emitter region of the manufacture of bipolar transistors of the npn type.

These implementations make it possible to manufacture the thyristor device "gratuitously", in parallel with a manufacture of bipolar transistors of the pnp type and of the npn type, for example already provided in the context of a bipolar technology or a "BiCMOS" bipolar complementary technology.

According to some implementations, the method comprises moreover a manufacture of a core circuit intended to execute functional tasks of the integrated circuit, and a formation of connection terminals connected to the core circuit, such as metal lines, comprising at least a first connection terminal intended to receive a power supply voltage during the functioning of the integrated circuit and at least a second connection terminal intended to receive a reference voltage during the functioning of the integrated circuit, and the said formation of the at least one thyristor semiconductor device respectively comprises a formation of at least a coupling of a thyristor semiconductor device between the said at least a first connection terminal and the said at least a second connection terminal, in order to protect the core circuit against electrostatic discharges on the said connection terminals.

The formation of the connection terminals can also comprise a formation of at least a third connection terminal intended for routing input-output signals during the functioning of the integrated circuit, and the said formation of at least one thyristor semiconductor device can respectively comprise a formation of at least one other coupling of a thyristor semiconductor device between the said at least a third connection terminal and the said at least a first connection terminal or the said at least a second connection terminal, in order to protect the core circuit against electrostatic discharges on the said connection terminals.

BRIEF DESCRIPTION OF THE SEVERAL VIEWS OF THE DRAWINGS

Other advantages and features of the disclosure will become apparent on examination of the detailed description of embodiments and implementations, which are in no way limiting, and of the appended drawings in which.

DETAILED DESCRIPTION

Figure 1:
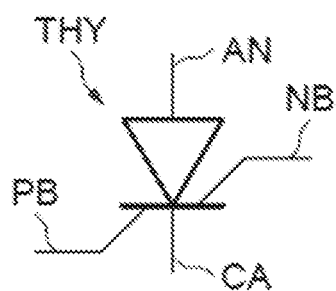
FIG. 1 shows an example of embodiment of the disclosure.

FIG. 1 shows a thyristor semiconductor device THY comprising an anode terminal AN, a cathode terminal CA, as well as an N-type base terminal NB and a P-type base terminal PB.

The base terminals NB, PB are typically called "gates" in relation to the effect of controlling the triggering of the on condition as a function of the biasing of the base terminals NB, PB.

Figure 2:
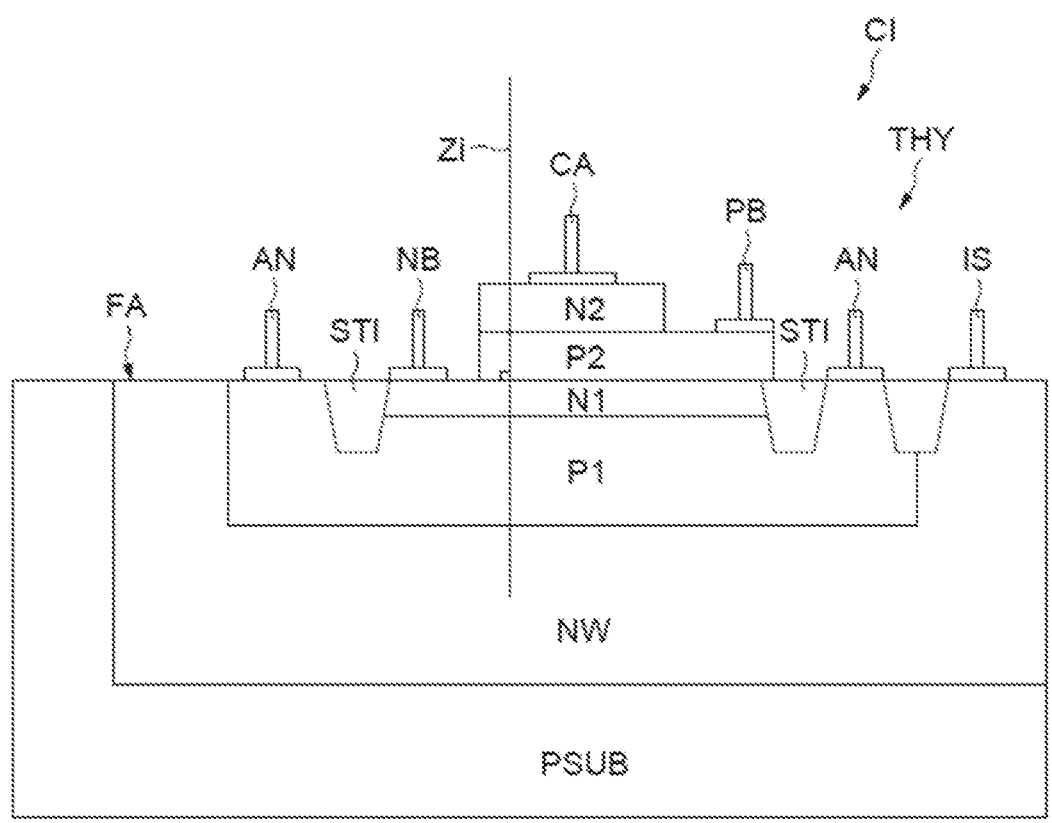
FIG. 2 shows an example of embodiment of the disclosure.

FIG. 2 shows a cross-sectional view of a portion of an integrated circuit CI comprising an example of embodiment of a thyristor semiconductor device THY, formed in a part of the integrated circuit commonly referred to by those skilled in the art with the acronym "FEOL" (standing for "Front End Of Line").

The thyristor semiconductor device THY is formed in and on a semiconductor substrate PSUB which comprises a front face FA.

Each of the terminals AN, NB, PB, CA of the thyristor THY comprises or is coupled to, for example, a metal contact intended for interconnections, electrically coupled to a respective semiconductor region for example via a film of metal silicide.

Thus, the anode terminal AN is coupled to anode semiconductor region P1, which is P-doped, the base terminal NB is coupled to a first base region N1, which is N-doped, the base terminal PB is coupled to a second base region P2, which is P-doped, and the cathode terminal CA is coupled to a cathode semiconductor region N2, which is N-doped.

Thus, the anode region P1, the first base region N1, the second base region P2, and the cathode region N2 are all superimposed along an axis Zi transverse to the front face FA, e.g., perpendicular to the front face FA.

Hereafter, an axis transverse to the front face FA will be denoted by the terms "vertical axis" or "vertical straight line". The terms relating to the vertical direction, such as above, on and below, under, are all with reference to an orientation in which the volume of the substrate PSUB is situated below the front face FA, and the exterior of the substrate PSUB along the vertical axis Zi is situated above the front face FA.

The semiconductor regions are superimposed one by one on a respective surface, and there is at least a portion of each surface superimposed (along a vertical axis) on at least a portion of each of the other surfaces.

Thus the thyristor semiconductor device THY comprises, from the anode terminal AN to the cathode terminal CA, a first pn junction between the anode region P1 and the first base region N1, a second pn junction between the first base region N1 and the second base region P2, and a third pn junction between the second base region P2 and the cathode region N2. Each pn junction is, at least partly, superimposed on or overlap with all of the other pn junctions along a vertical axis Zi.

The anode region P1 can be formed in an upper part of the substrate PSUB, at the level of the front face FA, by an implantation of dopants.

For example, the first base region N1 is situated in a space included in an upper part of the anode region P1, by implantation of dopants having a type of conductivity (N-type) opposite to the type of conductivity (P-type) of the anode region. The first base region N1 is thus situated between the anode region P1 and the front face FA of the substrate.

The first base region N1 is advantageously laterally isolated from the anode region P1 by a dielectric region STI. The dielectric region can thus have the shape of a ring (seen from above) surrounding the first base region N1. The dielectric region STI can be formed conventionally by a shallow trench isolation method.

The second base region P2 comprises a layer covering a portion of the surface of the first base region N1 situated at the level of the front face FA, inside the boundary of the dielectric region STI. The rest of the surface of the first base region N1 makes it possible to form the contact of the respective base terminal NB there.

The cathode region N2 comprises a layer covering a portion of the upper surface of the second base region P2. The rest of the surface of the second base region P2 makes it possible to form the contact of the respective base terminal PB there.

The second base region P2 and the cathode region N2 are thus situated above the front face FA of the substrate PSUB, the second base region P2 being situated between the front face FA and the cathode region N2.

Electrical isolation elements, such as spacers, are formed on the sides of the layers formed above the front face FA (P2, N2) in order to ensure electrical isolation of the various terminals (not shown).

Dielectric layers can be disposed between the said semiconductor regions superimposed along a vertical axis $Z_i$, for example in order to define openings of the pn junctions, and/or in the context of a re-use of method steps already provided for the formation of other semiconductor devices, such as bipolar pnp and npn transistors. This will be referred to below in relation to FIG. 4.

Moreover, the thyristor semiconductor device THY is formed in a part of the substrate PSUB (P-type) comprising a well NW of opposite conductivity (N-type) in order to ensure electrical isolation from the rest of the substrate PSUB. The well NW can comprise a biasing terminal IS, for example intended to receive a positive potential, in order to improve the electrical isolation effect.

The vertical structure of the thyristor semiconductor device THY makes it possible to reduce the surface dimensions of the device.

Moreover, it will be noted that the vertical thyristor THY makes it possible to separate the base regions N1, P2 from the substrate PSUB, and in this example, from the well NW. In fact, the pn junction between the N-type well NW and the anode region AN electrically isolates the first base region NB/N1 from the well NW. The second base region PB/P2 is likewise distanced from the well NW and is electrically isolated from the well NW. Thus, possible interference coming from the substrate PSUB or from the well NW are out of reach of the base regions NB, PB, contrary to the conventional designs in which typically at least one semiconductor region is situated laterally at a distance from the others.

The reduction in the size of the device, besides the advantage with regard to overall dimensions, notably makes it possible to limit current leakages in the off condition and thus to reduce the consumption of energy, and to introduce a minimal stray capacity at the terminals of the device.

Figure 3:
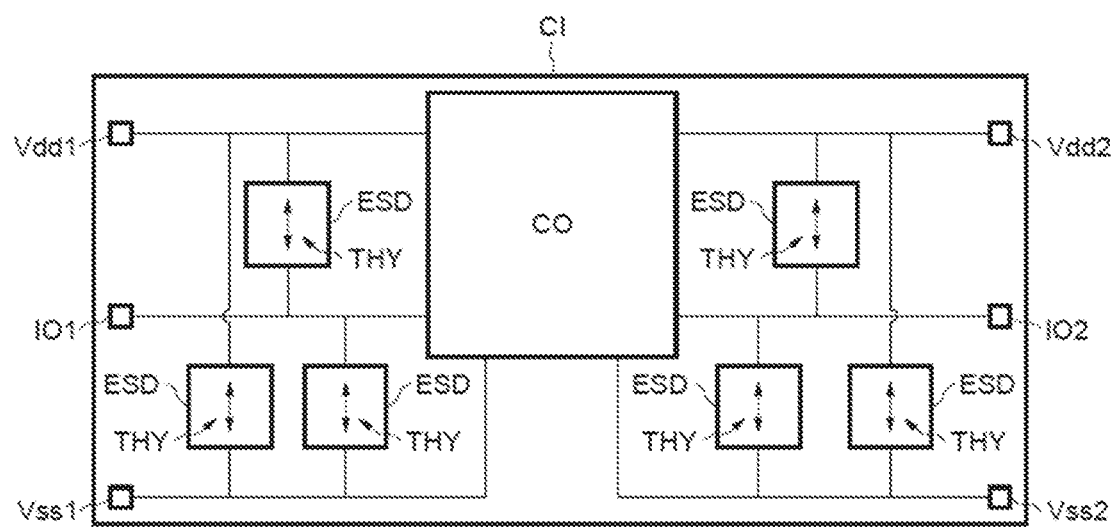
FIG. 3 shows an example of embodiment of the disclosure.

FIG. 3 shows a plan view of the integrated circuit CI comprising connection terminals Vdd1, Vdd2, IO1, IO2, Vss1, Vss2. For example, the said connection terminals are solder pads or pins for connecting the integrated circuit CI with the exterior. The integrated circuit CI also comprises a core CO, or core circuit, connected to the terminals and allowing the execution of tasks implementing the function or functions of the integrated circuit CI.

For example, the connection terminals can comprise first connection terminals Vdd1, Vdd2 intended to receive power supply voltages during an operational use of the integrated circuit CI.

Likewise, second connection terminals Vss1, Vss2 are intended to receive reference voltages, typically the earth, during an operational use of the integrated circuit CI.

Moreover, third connection terminals IO1, IO2 are intended to receive input-output signals during the operation of the integrated circuit CI.

For example the input-output signals can be signals intended for a communication on an integrated circuit bus or radiofrequency communications.

The integrated circuit CI comprises moreover assemblies ESD configured for protecting the core circuit CO against electrostatic discharges on each connection terminal.

The assemblies ESD for protection against the electrostatic discharges each comprise a thyristor semiconductor device THY such as the ones described above with reference to FIGS. 1 and 2.

For example, an assembly for protection against electrostatic discharges can comprise a thyristor semiconductor device THY. The bidirectional effect of the protection can be obtained, for example but not restrictively, by connecting a diode (not shown for simplicity) in parallel with the thyristor semiconductor device THY.

The assemblies ESD for protection against electrostatic discharges can for example be connected between the terminals intended for receiving a power supply voltage Vdd1, Vdd2 and the terminals intended for receiving a reference voltage Vss1, Vss2, as well as between the terminals intended for routing input-output signals IO1, IO2 and the terminals intended for receiving a power supply voltage Vdd1, Vdd2 or a reference voltage Vss1, Vss2.

Because of the low stray capacity of the thyristor devices THY mentioned above, the terminals intended for routing input-output signals IO1, IO2 can be intended for routing sensitive signals such as radiofrequency signals, without the presence of the thyristors THY degrading the performance of the integrated circuit CI.

Because of the small size of the thyristor semiconductor devices THY incorporated in the integrated circuit CI, the overall size of the integrated circuit can be reduced, or the space available for the production of the core circuit CO can be increased.

The base terminals NB, PB can possibly be biased, for example via resistive assemblies, in order to adjust the triggering voltage of the thyristors THY to a desired value.

Figure 4:
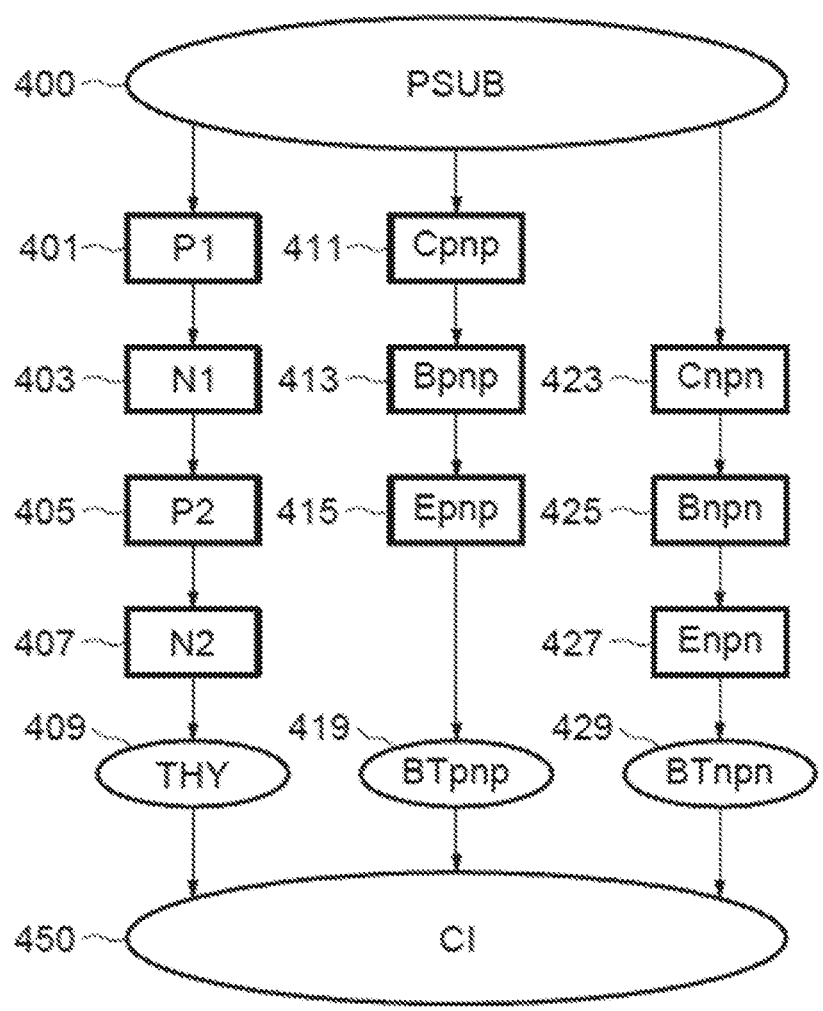
FIG. 4 shows an example of implementation of the disclosure.

FIG. 4 shows an example of implementation of an integrated circuit CI comprising a formation of at least a thyristor semiconductor device THY, of the type of the one described above with reference to FIGS. 1 to 3, in and on a substrate PSUB of the integrated circuit having a front face FA.

The example shown in FIG. 4 is advantageously implemented simultaneously with steps of formations of bipolar transistors of the pnp type BTpnp and of the npn type BTnpn formed on the same semiconductor substrate PSUB. The bipolar transistors BTpnp and BTnpn indifferently being able to be heterojunction or homojunction bipolar transistors.

During an initial step 400, formations of wells such as the well NW described above with reference to FIG. 2, as well as for example the manufacture of lateral isolation regions (for example of the shallow trench isolation type) can be carried out. For example, a dielectric region (STI) laterally delimiting the future first base region N1 of the future anode region P1 can be formed during the step of manufacturing lateral isolation regions.

The manufacture of the (at least one) thyristor THY can thus comprise:

- a formation 401 of the anode region P1 included in a step of formation 411 of a collector region Cpnp of the manufacture of the transistors BTpnp. The formations 401, 411 comprise for example implantations of P-type dopants in a well NW. The anode region P1 and the collector region Cpnp can possibly be formed directly by the substrate PSUB as such;
- a formation 403 of the first base region N1 included in a step of formation 413 of a base region Bpnp of the manufacture of the transistors BTpnp. The formations 403, 413 comprise for example an implantation of dopants, in a space included in an upper part of the anode region P1 or of the collector Cpnp respectively;
- a formation 405 of the second base region P2 included in a step of formation 415 of a base region Bnpn of the manufacture of the transistors BTnpn or included in a step of formation 425 of an emitter region Epnp of the manufacture of the transistors BTpnp. The formations 405, 415, 425 can comprise an intrinsic silicon epitaxy and a deposit of extrinsic silicon (that is to say doped silicon), followed by an etching of the non-useful parts of the deposited silicon;
- a formation 407 of the cathode region N2 included in a step of formation 427 of an emitter region Enpn of the manufacture of the transistors BTnpn. The formations 407, 427 can comprise an extrinsic silicon epitaxy, followed by a removal by etching of the non-useful parts of the deposited silicon.

The formations 401, 403, 405, 407 of the different semiconductor regions of the thyristor THY are of course arranged such that the anode region P1, the first base region N1, the second base region P2, and the cathode region N2 are all superimposed along an axis (Zi) transverse to the front face (FA).

Then, following and finalizing steps 450 can notably comprise the formations of the contacts on the respective semiconductor regions of the thyristor THY as well as a manufacture of connection terminals of the integrated circuit CI, such as solder pads or pins. The anode contact (AN) can be coupled to a connection terminal and the cathode contact (CA) to another connection terminal.

Moreover, it is considered that the following steps 450 can also comprise a manufacture of a core circuit (CO), possibly able to comprise the bipolar transistors BTpnp and BTnpn obtained in steps 419 and 429, and possibly logic technologies of the CMOS type, in a context of BiCMOS complementary bipolar integration.

The connection terminals are connected to the core circuit and allow its operation.

Moreover, the method can advantageously be configured so that the said formation (401-409) of at least one thyristor semiconductor device THY comprises a formation of assemblies ESD for protection against electrostatic discharges, between at least some of the said connection terminals.

For example, the formations of the assemblies ESD each comprise a formation of a thyristor semiconductor device THY, possibly in parallel with a conventional diode.

Moreover, the disclosure is not limited to these examples of embodiment and implementation but includes all variants, for example the manufacturing steps 401-409 can be implemented independently in order to produce a thyristor device alone. Only certain steps of manufacturing the thyristor can be used simultaneously with an already provided method, and the other steps are used in a manner dedicated to the manufacture of the thyristor. Moreover, the manufacturing steps described here are voluntarily simplified and the vertical structure of the thyristor semiconductor device according to the disclosure can be compatible with other methods of manufacture of semiconductor components.

The various embodiments described above can be combined to provide further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising:
   a substrate having a front face and at least one thyristor semiconductor device situated in and on the substrate, the at least one thyristor semiconductor device including:
   an anode region,
   a first base region,
   a second base region, the first base region and the second base region having opposite types of conductivity, and
   a cathode region,
   wherein the anode region, the first base region, the second base region and the cathode region each overlaps one another along a direction transverse to the front face of the substrate, and the first base region is laterally separated from the anode region by a dielectric region.

2. The integrated circuit of claim 1, wherein the first base region is situated between the anode region and the front face of the substrate.

3. The integrated circuit of claim 2, wherein the first base region is laterally separated from the anode region by the dielectric region that extends into the anode region from the front face of the substrate.

4. The integrated circuit of claim 1, wherein the second base region and the cathode region are positioned over the front face of the substrate, the second base region being positioned vertically between the first base region and the cathode region.

5. The integrated circuit of claim 1, wherein the anode region and the second base region each includes P-doped silicon, and wherein the first base region and the cathode region each include N-doped silicon.

6. The integrated circuit of claim 1, further comprising a core circuit configured for executing functional tasks of the integrated circuit, a plurality of connection terminals connected to the core circuit, and a first assembly including a first thyristor semiconductor device of the at least one thyristor semiconductor device, a first connection terminal of the plurality of connection terminals being intended to receive a power supply voltage during an operation of the integrated circuit, a second connection terminal of the plurality of connection terminals being intended to receive a reference voltage during the operation of the integrated circuit, and the first assembly being coupled between the first connection terminal and the second connection terminal, and being configured for protecting the core circuit against electrostatic discharges on the first or second connection terminals.

7. The integrated circuit of claim 6, further comprising a third connection terminal intended to route input-output signals during the operation of the integrated circuit, and a second assembly comprising a second thyristor semiconductor device of the at least one thyristor semiconductor device, the second assembly being coupled between the third connection terminal and the first connection terminal, and the second assembly being configured for protecting the core circuit against electrostatic discharges on the first or the third connection terminals.

8. The integrated circuit of claim 6, further comprising a third connection terminal intended to route input-output signals during the operation of the integrated circuit, and a second assembly comprising a second thyristor semiconductor device of the at least one thyristor semiconductor device, the second assembly being coupled between the third connection terminal and the second connection terminal, and the second assembly being configured for protecting the core circuit against electrostatic discharges on the second or the third connection terminals.

9. A method of manufacturing an integrated circuit comprising:
    forming at least a thyristor semiconductor device in and on a substrate, the substrate having a front face, the forming the thyristor semiconductor device including:
        forming an anode region,
        forming a dielectric region in the anode region,
        forming a first base region in the anode region, the first base region laterally separated from the anode region by the dielectric region,
        forming a second base region, the first base region and the second base region having opposite types of conductivity, and
        forming a cathode region, the anode region, the first base region, the second base region, and the cathode region being all superimposed on one another along an axis transverse to the front face.

10. The method of claim 9, wherein the forming the first base region includes implanting dopants in a part of the anode region adjacent to the front face of the substrate.

11. The method of claim 10, wherein the forming the dielectric region includes forming the dielectric region that extends into the anode region from the front face of the substrate.

12. The method of claim 9, wherein the forming the second base region includes forming a first semiconductor layer above the front face, and wherein the forming the cathode region includes forming a second semiconductor layer above the first semiconductor layer of the second base region.

13. The method of claim 9, wherein the forming the anode region and the forming the second base region each includes forming P-doped silicon, and
    wherein the forming the first base region and the forming the cathode region each includes forming N-doped silicon.

14. The method of claim 9, further comprising forming an npn bipolar transistor and forming a pnp bipolar transistor, wherein:
    the forming the anode region also forms a collector region of the pnp bipolar transistor;
    the forming the first base region also forms a base region of the pnp bipolar transistor;
    the forming the second base region also forms an emitter region of the pnp bipolar transistor, or a base region of the npn bipolar transistor; and
    the forming the cathode region also forms an emitter region of the npn bipolar transistor.

15. The method of claim 9, further comprising forming a core circuit configured to execute functional tasks of the integrated circuit, and forming connection terminals connected to the core circuit;
    wherein the connection terminals includes a first connection terminal intended to receive a power supply voltage during a functioning of the integrated circuit and a second connection terminal intended to receive a reference voltage during the functioning of the integrated circuit; and
    wherein the forming the at least one thyristor semiconductor device includes coupling a first thyristor semiconductor device of the at least one thyristor semiconductor device between the first connection terminal and the second connection terminal in order to protect the core circuit against electrostatic discharges on one or more of the first or the second connection terminals.

16. The method of claim 15, wherein the connection terminals further includes a third connection terminal intended for routing input-output signals during the functioning of the integrated circuit; and
    wherein the forming the at least one thyristor semiconductor device includes coupling a second thyristor semiconductor device of the at least one thyristor semiconductor device between the third connection terminal and the first connection terminal in order to protect the core circuit against electrostatic discharges on one or more of the first or the third connection terminals.

17. The method of claim 15, wherein the connection terminals further includes a third connection terminal intended for routing input-output signals during the functioning of the integrated circuit; and
    wherein the forming the at least one thyristor semiconductor device includes coupling a third thyristor semiconductor device of the at least one thyristor semiconductor device between the third connection terminal and the second connection terminal in order to protect the core circuit against electrostatic discharges on one or more of the second or the third connection terminals.

* * * * *